United States Patent [19]

Frosien et al.

[11] Patent Number: 5,061,856
[45] Date of Patent: Oct. 29, 1991

[54] CORPUSCULAR BEAM DEVICE

[75] Inventors: Jürgen Frosien, Ottobrunn; Rainer Spehr, Ober-Ramstadt, both of Fed. Rep. of Germany

[73] Assignee: ICT Integrated Circuit Testing Gesellschaft fur, Halbleiterpruftchnik mbH, Fed. Rep. of Germany

[21] Appl. No.: 612,507

[22] Filed: Nov. 14, 1990

[30] Foreign Application Priority Data

Nov. 21, 1989 [DE] Fed. Rep. of Germany ....... 3938660

[51] Int. Cl.$^5$ .................. H01J 37/252; G01T 1/20; G01N 23/00; G01B 15/00
[52] U.S. Cl. .................. 250/397; 250/309; 250/310
[58] Field of Search .......... 250/309, 310, 397

[56] References Cited

U.S. PATENT DOCUMENTS

| 4,442,355 | 4/1984 | Tamura et al. | 250/310 |
| 4,658,136 | 4/1987 | Ohtaka et al. | 250/310 |
| 4,831,267 | 5/1989 | Brunner | 250/397 |
| 4,939,371 | 7/1990 | Goto | 250/397 |
| 4,987,311 | 1/1991 | Devore | 250/492.2 |
| 4,990,778 | 2/1991 | Norioka | 250/310 |

Primary Examiner—Jack I. Berman
Assistant Examiner—Jacob M. Eisenberg
Attorney, Agent, or Firm—Learman & McCulloch

[57] ABSTRACT

The invention relates to a corpuscular beam device, such as an ion beam device or an electron beam device, in which a primary corpuscular beam is focussed by means of an objective lens onto a sample. The secondary radiation emitted at the point of impact of the primary beam is accelerated onto the central electrode of the objective lens, this electrode being coated with scintillation material, and there produces light pulses which are converted by a light-sensitive detector into electrical signals and amplified.

10 Claims, 3 Drawing Sheets

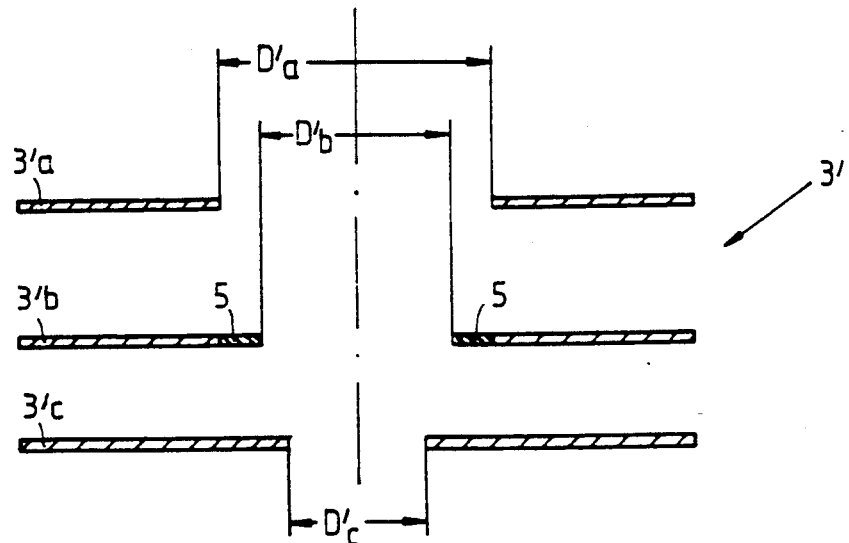
FIG. 4
FIG. 5
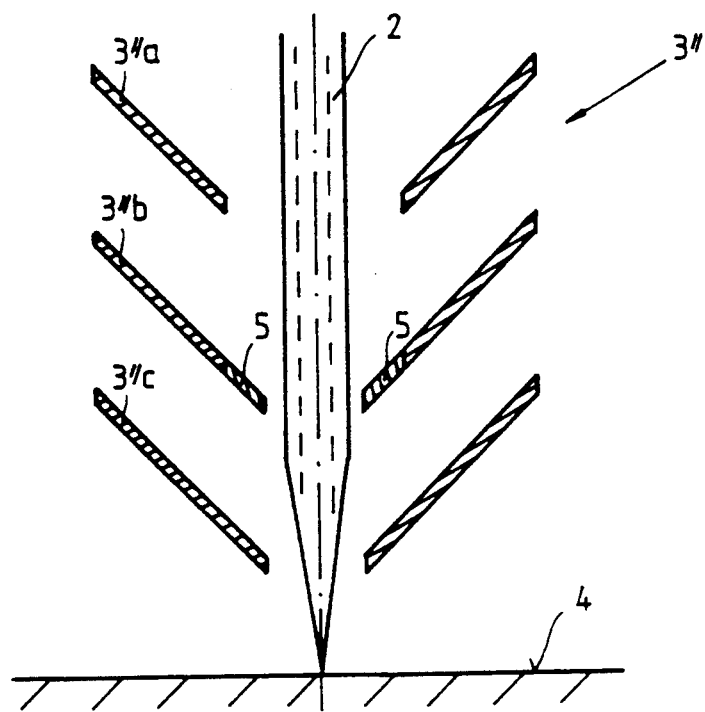

CORPUSCULAR BEAM DEVICE

The invention relates to a corpuscular beam device according to the preamble to claim 1.

Devices of the type set out in the preamble to claim 1 are known in the art.

Nowadays corpuscular beam devices are used for microprocessing of samples, for example for removal or application of materials, as well as in analysis. When these devices are operating in image mode, the primary corpuscular beam is focussed on a sample and the secondary radiation emitted in that case is detected and plotted.

This results in an image of the surface of the sample depending upon the secondary radiation. With increasing resolving power of the devices the diameter of the corpuscular probe is correspondingly reduced, so that according to the equation $$i = R * \pi^2/4 * d^2 * \alpha^2$$

the current i of the primary corpuscular probe is reduced. In this case
R = the directional beam value of the corpuscular source,
d = probe diameter of the corpuscular probe,
$\alpha$ = permissible aperture angle of the objective lens to achieve the probe diameter d.

As a consequence of this the emitted secondary radiation is also reduced, so that the signal/noise ration S/R deteriorates. Therefore in order to produce high-quality images with a good signal/noise ratio S/R it is necessary to use long image-recording times.

In the known corpuscular beam devices detectors which are arranged between the focussing objective lens and the sample are used for detecting the secondary radiation. In this case the emitted secondary radiation is drawn off by an appropriately biased electrode and accelerated onto a scintillator. The light produced there is converted into an electrical signal in a photomultiplier and amplified. Other detectors directly amplify the secondary radiation which is drawn off, without working via the scintillator.

However, the suction field of such arrangements has a disadvantageous effect on the primary beam. On the one hand it deflects the primary beam and on the other hand it causes expansion of the probe.

The high-resolution devices which work with particularly fine probes must work with a small distance between the objective lens and the sample, i.e. with very short focal length, in order to keep the lens aberration sufficiently small. This in turn leads to further difficulties in the case of drawing off the secondary radiation with conventional detector arrangements. On the one hand the penetration of the suction field strength reduces as the working distance becomes shorter and on the other hand a further competing suction field is created by the nearness of the electrostatic focussing field of the objective lens. Both facts impair the collection and detection of the secondary radiation.

The object of the invention, therefore, is to make further developments to the corpuscular beam device set out in the preamble to claim 1 in such a way that it is distinguished by a high degree of efficiency in the collection and the detection of the secondary radiation.

This object is achieved according to the invention by the characterising feature of claim 1.

By using the central electrode of the electrostatic objective lens as a collector electrode it is possible to collect almost all of the secondary radiation on the central electrode. A scintillator material present there converts the secondary radiation into light pulses. By this means it is possible to produce images of the sample with optimal signal/noise difference S/R in the shortest possible time.

With such an arrangement there is no need for any space between the objective lens and the sample for a detector arrangement, so that the working distance and thus the lens aberration of the objective lens can be kept small.

A further advantage of this arrangement lies in the rotationally symmetrical electrostatic field of the central electrode which does not have any negative effects on the primary beam, and in particular does not cause any unintentional deflections or expansions of the probe.

Further features of the invention are the subject matter of the subordinate claims and are explained in greater detail in connection with the drawings and the following description.

In the drawings:

FIG. 4 shows a sectional view through a further embodiment of an objective lens, FIG. 5 shows a sectional view through a further embodiment of an objective lens.

Figure 1:
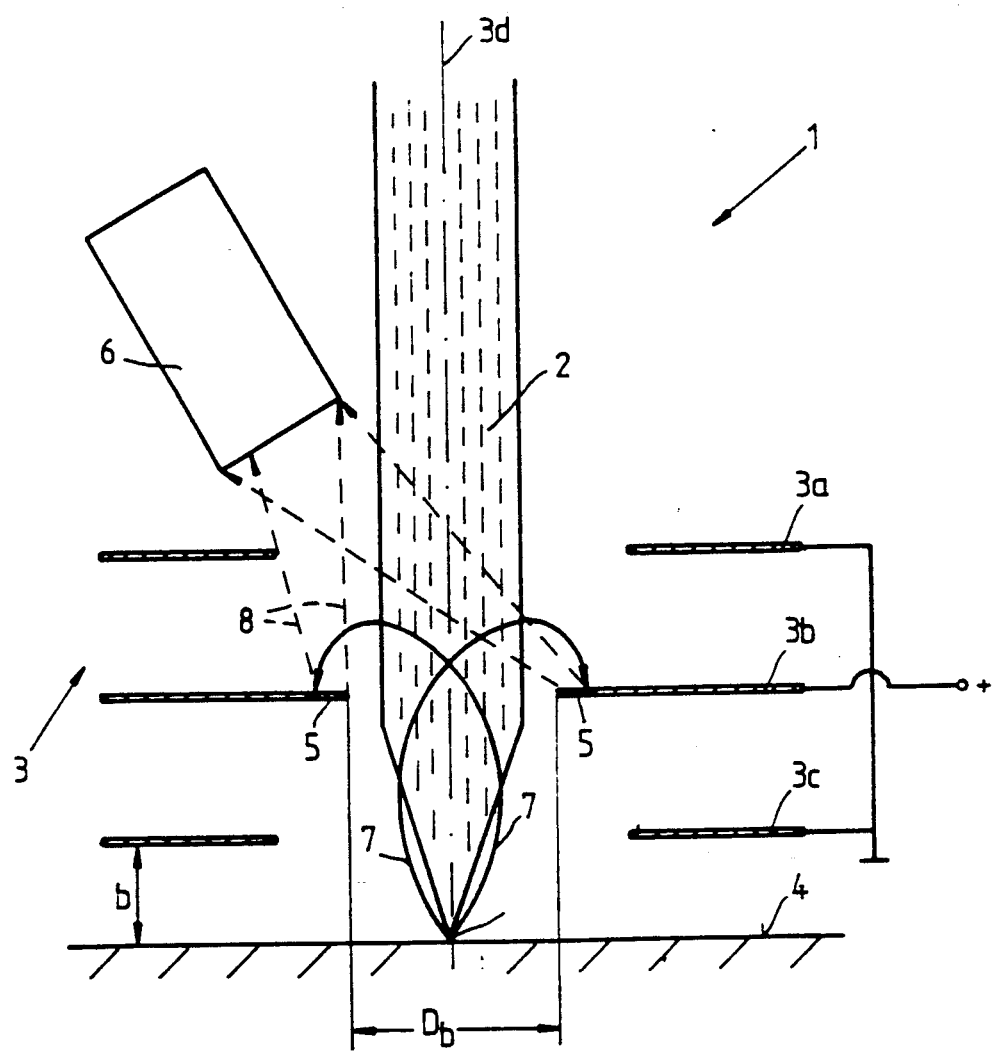
FIG. 1 shows a schematic sectional view of the corpuscular beam device.

A corpuscular beam device 1 is shown schematically in FIG. 1. It contains an arrangement (which is not shown) for producing a primary corpuscular beam 2 which is focussed by an electrostatic objective lens 3 onto a sample 4. Depending upon the application, the primary beam 2 can be formed by an ion beam or by an electron beam.

The electrostatic objective lens 3 has three electrodes 3a, 3b and 3c which are constructed as flat annular discs. The three electrodes 3a, 3b and 3c are arranged behind one another in the direction of the primary beam 2, so that the axis of the primary beam 2 coincides with the axis 3d of the objective lens 3.

A narrow annular zone of the central electrode 3b surrounding the opening in the said electrode is provided at least on the side facing away from the sample 4 with scintillator material which forms a scintillator 5. A light-sensitive detector 6, such as for example a photomultiplier, which is aligned with the scintillator 5 of the central electrode 3b is arranged above the electrostatic objective lens 3.

The positive ion beam 2 shown in FIG. 1 which is focussed by the objective lens produces a secondary radiation at the point of impact A on the sample 4. In the objective lens the two outer electrodes 3a and 3c are connected to earth, whilst the central electrode 3b has a strongly positive potential. As a result the negative particles of the secondary radiation, such as for example, electrons, are accelerated onto the central electrode 3b and thus onto the scintillator 5 (line 7). the secondary radiation striking the scintillator 5 produces light pulses which pass to the photomultiplier 6 (broken arrows 8)

where they are converted into electrical signals and amplified.

No additional voltage is necessary for the acceleration of the secondary radiation onto the scintillator 5, since the scintillator 5 has a sufficiently high potential due to its coupling to the central electrode 3b.

Since the scintillator 5 is located inside the objective lens 3, the working distance b between the objective lens 3 and the sample 4 can be kept small, so that as a result the lens aberrations also remain small. In addition, due to the rotationally symmetrical field of the central electrode 3b on the one hand an undesirable deflection and on the other hand an expansion of the probe at the impact point A is avoided.

Figure 2:
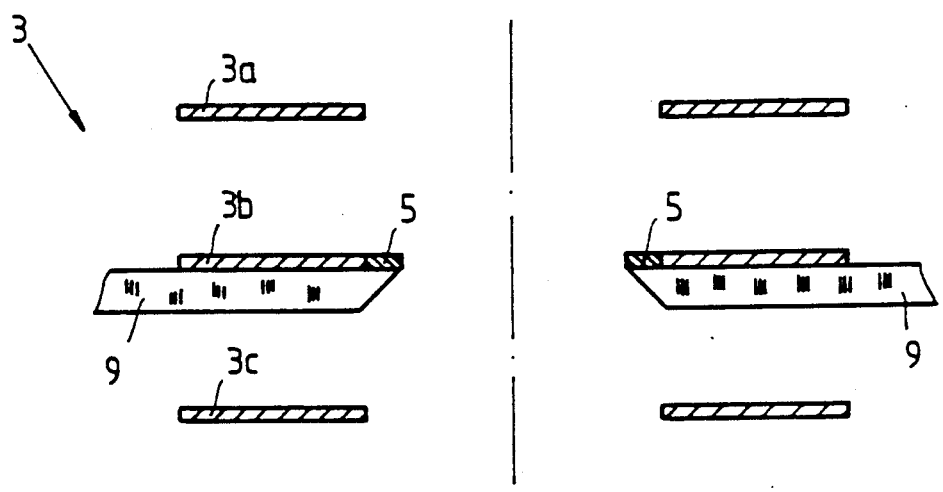
FIG. 2 shows a schematic sectional view through a first embodiment of an objective lens and a light-transmitting unit.

In the objective lens 3 shown in FIG. 2 photoconductors 9 are arranged on the lower side of the central electrode 3b facing the sample 4.

In operation the flashes of light produced in the scintillator 5 are not longer passed directly to the photomultiplier 6 but indirectly via the photoconductor 9.

Figure 3:
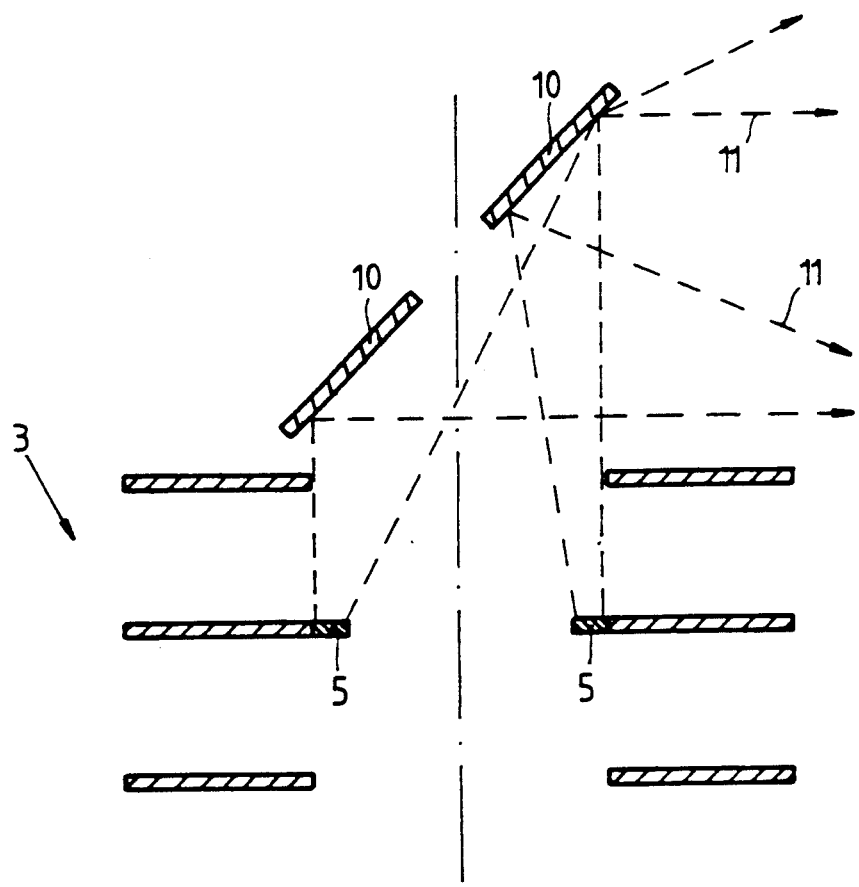
FIG. 3 shows a sectional view through a second embodiment of an objective lens and light-transmitting unit.

In FIG. 3 the light-transmitting unit is formed by a mirror system 10 arranged above the objective lens 3. The light pulses produced in the scintillator 5 are deflected according to the broken arrows 11 to the mirror system 10 and passed to the photomultiplier 6.

Apart from the light-transmitting units already described above, such as the photoconductor 9 or the mirror system 10, a lens system can also be used.

In the objective lens 3 shown in FIG. 1, the central electrode 3b has a smaller opening diameter $D_b$ than the two electrodes 3a and 3c which are constructed and arranged symmetrically with respect to the central electrode 3b.

FIG. 4 also shows a planar electrostatic objective lens, but this has an asymmetric electrode construction. The outer electrode 3'c of the objective lens 3' facing the sample has a smaller opening diameter $D'_c$ than the two other electrodes 3'a and 3'b. The diameter $D'_b$ of the central electrode 3'b is again smaller than the diameter $D'_a$ of the electrode 3'a facing away from the sample.

A conical electrostatic objective lens 3″ is shown in FIG. 5 as a further embodiment. In this case the electrodes 3″a, 3″b and 3″c of the primary beam 3″ are constructed as cone elements which taper in the direction of the primary beam 2.

Within the scope of the invention all types of electrostatic objective lenses are conceivable, such as for example single lenses, flat and conical constructions and immersion lenses.

We claim:

1. Corpuscular beam device, such as an ion beam device or an electron beam device, containing
    a) an arrangement for producing a primary corpuscular beam (2),
    b) an electrostatic objective lens (3) which focusses the primary beam (2) onto a sample (4) and contains three rotationally symmetrical electrodes (3a, 3b. 3c) arranged behind one another in the beam direction, the axis of the primary beam (2) coinciding with the axis (3d) of the objective lens (3),
    c) an arrangement which draws off the secondary radiation emitted on the sample (4) at the point of impact (A) of the primary beam (2),
    d) a scintillator (5) arranged in the beam path of the secondary radiation, characterised by the following feature:
    e) the scintillator (50 is formed by the central electrode (3b) of the objective lens (3).

2. Device as claimed in claim 1, characterised in that the primary corpuscular beam (2) is formed by an ion beam.

3. Device as claimed in claim 1, characterised in that the primary corpuscular beam (2) is formed by an electron beam.

4. Device as claimed in claim 1, characterised in that the electrodes (3a, 3b, 3c) of the objective lens (3) are constructed as flat annular discs.

5. Device as claimed in claim 4, characterised in that the central electrode (3b) of the objective lens (3) has a smaller opening diameter ($D_b$) than the two electrodes (3a, 3c) which are constructed and arranged symmetrically with respect to the central electrode (3b).

6. Device as claimed in claim 4, characterised in that the outer electrode (3'c) of the objective lens (3') facing the sample have a smaller opening diameter ($D'_c$) than the two other electrodes (3'a, 3'b), the central electrode (3'b) for its part having a smaller opening diameter ($D'_b$) than the electrode (3'a) facing away from the sample.

7. Device as claimed in claim 1, characterised in that the electrodes (3″a, 3″b, 3″c) of the objective lens (3″) are constructed as cone elements which taper in the direction of the primary corpuscular beam (2).

8. Device as claimed in claim 1, in which a light-sensitive detector (6) is connected to the scintillator (5), characterised in that the scintillator (5) is connected to the light-sensitive detector (6) by a light-transmitting unit (9, 10), preferably a photoconductor, a mirror system or a lens system.

9. Device as claimed in claim 1, in which a light-sensitive detector (6) is arranged after the scintillator (5), characterised by a direct radiation of the light produced in the scintillator (5) to the light-sensitive detector (6).

10. Device as claimed in claim 1, characterised in that a narrow annular zone of the central electrode (3b, 3'b, 3″b) surrounding the opening of the central electrode is provided at least on the side facing away from the sample with scintillation material and forms the scintillator (5).

* * * * *